(12) United States Patent
Yang et al.

(10) Patent No.: US 9,598,308 B2
(45) Date of Patent: Mar. 21, 2017

(54) FUNCTIONAL MATERIAL AND PREPARATION METHOD THEREOF, DISPLAY STRUCTURE FORMING MATERIAL, COLOR FILM SUBSTRATE, DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN); Jiantao Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/758,437

(22) PCT Filed: Oct. 15, 2014

(86) PCT No.: PCT/CN2014/088679
§ 371 (c)(1),
(2) Date: Jun. 29, 2015

(87) PCT Pub. No.: WO2015/067120
PCT Pub. Date: May 14, 2015

(65) Prior Publication Data
US 2015/0331315 A1    Nov. 19, 2015

(30) Foreign Application Priority Data

Nov. 8, 2013  (CN) .......................... 2013 1 0554220
Nov. 8, 2013  (CN) .......................... 2013 1 0554231
(Continued)

(51) Int. Cl.
*C03C 3/14*        (2006.01)
*C03C 3/064*       (2006.01)
(Continued)

(52) U.S. Cl.
CPC ................ *C03C 3/14* (2013.01); *C03C 3/064* (2013.01); *C03C 8/24* (2013.01); *C03C 17/32* (2013.01);
(Continued)

(58) Field of Classification Search
None
See application file for complete search history.

(56) References Cited

U.S. PATENT DOCUMENTS 5,403,787 A  *  4/1995  Day .................... C04B 38/0006
                                               501/39
2003/0039771 A1*  2/2003  Hachitani ............... B32B 17/06
                                               428/1.32
(Continued)

FOREIGN PATENT DOCUMENTS

CN       1358803 A  *  7/2002  ............... C09C 3/10
CN    101296872 A     10/2008
(Continued)

OTHER PUBLICATIONS

Derwent English abstract for CN 102351421 A (Feb. 15, 2012).*
(Continued)

*Primary Examiner* — Sin Lee
(74) *Attorney, Agent, or Firm* — Ladas & Parry LLP

(57) ABSTRACT

An embodiment of the present invention provides an environment-friendly functional material and a preparation method thereof, a display structure forming material, a color film substrate and a display device. The functional material comprises inorganic mixed powder, the inorganic mixed powder comprising a main material and an auxiliary material, the main materials comprising boron oxide, sodium oxide, lithium oxide, and zirconium oxide, the auxiliary materials comprising any one or more of aluminum oxide, zinc oxide, titanium dioxide, silicon dioxide, calcium oxide, silver complex, silver phosphate, silver nitrate, tourmaline, silver thiosulfate, carbon nanotube, aluminum sulfate, manganese, oxides of manganese, iron, oxides of iron, cobalt, oxides of cobalt, nickel, oxides of nickel, chromium, oxides of chromium, copper, oxides of copper, magnesium oxide, boron carbide, silicon carbide, titanium carbide, zirconium carbide, tantalum carbide, molybdenum carbide, boron nitride, chromium nitride, titanium nitride, zirconium nitride, aluminum nitride, chromium boride, trichromium tetraborate, titanium boride, zirconium boride, tungsten disilicide and titanium disilicide.

35 Claims, 2 Drawing Sheets

(30) Foreign Application Priority Data

| | | |
|---|---|---|
| Nov. 8, 2013 | (CN) | 2013 1 0554245 |
| Nov. 8, 2013 | (CN) | 2013 1 0554246 |
| Nov. 8, 2013 | (CN) | 2013 1 0554620 |
| Dec. 31, 2013 | (CN) | 2013 1 0750843 |

(51) Int. Cl.

| | |
|---|---|
| C03C 8/24 | (2006.01) |
| C03C 17/32 | (2006.01) |
| G03F 7/028 | (2006.01) |
| G03F 7/029 | (2006.01) |
| G03F 7/031 | (2006.01) |
| G03F 7/032 | (2006.01) |
| C08F 290/06 | (2006.01) |

(52) U.S. Cl.
CPC .......... *C08F 290/067* (2013.01); *G03F 7/028* (2013.01); *G03F 7/029* (2013.01); *G03F 7/031* (2013.01); *G03F 7/032* (2013.01)

(56) References Cited

U.S. PATENT DOCUMENTS

| | | | |
|---|---|---|---|
| 2009/0017196 A1* | 1/2009 | Fujimine | ................. C03C 3/066 427/126.2 |
| 2011/0181818 A1* | 7/2011 | Minato | ................. G02B 5/201 349/106 |
| 2013/0186140 A1 | 7/2013 | Brix et al. | |
| 2015/0168827 A1 | 6/2015 | Yang et al. | |

FOREIGN PATENT DOCUMENTS

| | | |
|---|---|---|
| CN | 101296982 A | 10/2008 |
| CN | 101343144 A | 1/2009 |
| CN | 102351421 A | 2/2012 |
| CN | 102892723 A | 1/2013 |
| CN | 103376657 A | 10/2013 |
| CN | 103555003 A | 2/2014 |
| CN | 103739205 A | 4/2014 |
| WO | WO 2011/104018 A2 * | 9/2011 |

OTHER PUBLICATIONS

English translation for CN 1358803A provided by Google (2002).*
English abstract for CN 1358803 A (2002).*
First Chinese Office Action dated Jul. 3, 2015; Appln. No. 201310750843.9.
Second Chinese Office Action dated Dec. 2, 2015; Appln. No. 201310750843.9.
International Search Report mailed Jan. 21, 2015; PCT/CN2014/088679.
Written Opinion of the International Searching Authority mailed Jan. 21, 2015; PCT/CN2014/088679.
Third Chinese Office Action dated Apr. 7, 2016; Appln. No. 201310750843.9.
Fourth Chinese Office Action dated Sep. 20, 2016; Appln. No. 201310750843.9.

* cited by examiner

FUNCTIONAL MATERIAL AND PREPARATION METHOD THEREOF, DISPLAY STRUCTURE FORMING MATERIAL, COLOR FILM SUBSTRATE, DISPLAY DEVICE

FIELD OF THE INVENTION

An embodiment of the present invention relates to a functional material as well as a preparation method thereof, a display structure forming material, a color film substrate, a display device.

BACKGROUND OF THE INVENTION

The application of the display devices such as computer display and television is more and more widespread. At the same time, the awareness of environment protection of people is also continuously increased. Therefore, it is very important to ensure the environment friendly degree of the display device such that it will not have an impact on the environment during the preparation and use.

In the existing display devices, display structures such as color light filter film (color film), Black Matrix (BM), Padding Substance (PS) and Over Coating (OC) are formed by a display structure forming material. The display structure forming material generally comprises a volatile organic solvent, and therefore there will be a large amount of solvent released to the air in the process of forming the display structure, resulting in reduced air quality.

Therefore, there exists a need for the environment-friendly functional material in the art.

SUMMARY OF THE INVENTION

An embodiment of the present invention provides an environment-friendly functional material comprising inorganic mixed powder, the inorganic mixed powder comprising a main material and an auxiliary material;

The main material comprises boron oxide, sodium oxide, lithium oxide and zirconium oxide;

The auxiliary material comprises any one or more of aluminum oxide, zinc oxide, titanium dioxide, silicon dioxide, calcium oxide, silver complex, silver phosphate, silver nitrate, tourmaline, silver thiosulfate, carbon nanotube, aluminum sulfate, manganese, oxides of manganese, iron, oxides of iron, cobalt, oxides of cobalt, nickel, oxides of nickel, chromium, oxides of chromium, copper, oxides of copper, magnesium oxide, boron carbide, silicon carbide, titanium carbide, zirconium carbide, tantalum carbide, molybdenum carbide, boron nitride, chromium nitride, titanium nitride, zirconium nitride, aluminum nitride, chromium boride, trichromium tetraborate, titanium boride, zirconium boride, tungsten disilicide and titanium disilicide.

In one embodiment, the inorganic mixed powder also comprises an addition material comprising any one or more of graphite, mica, indigo stone, calcite, crystal fluorite, maifanite, and mullite.

The addition material is in an amount from 1 to 5% of the total amounts of the main material and the auxiliary material.

In one embodiment, the inorganic mixed powder has a particle diameter from 20 to 300 nm.

In one embodiment, the inorganic mixed powder has a surface modified layer formed by a light curable alkaline soluble resin having a molecular weight less than or equal to 5000 and greater than or equal to 2500.

The surface modified layer is formed by copolymerization of a polymerizable vinylated unsaturated monomer and an organic anhydride.

The polymerizable vinylated unsaturated monomer is any one of styrene, vinyl toluene, p-chloro styrene, methoxy styrene, α-methyl styrene, and isoprene; and the organic anhydride is any one of maleic anhydride, cis-butenedioic anhydride, Fumaric Anhydride, itaconic anhydride, citraconic anhydride, pyromellitic dianhydride, biphenyltetracarboxylic dianhydride, benzophenonetetracarboxylic dianhydride, oxygen biphenyltetracarboxylic dianhydride, and isopropyl diphthalic anhydride.

The inorganic mixed powder, the organic anhydride, and the polymerizable vinylated unsaturated monomer are in a weight ratio of 1:(0.8-1.2):(0.85-1.15).

In one embodiment, the inorganic mixed powder, based on parts by weight, comprises:
boron oxide: 1.5-10 parts;
sodium oxide: 0.5-5 parts;
lithium oxide: 0.2-20 parts;
zirconium oxide: 10-50 parts;
aluminum oxide: 5-40 parts;
titanium dioxide: 0.5-8 parts.

In one embodiment, the inorganic mixed powder, based on parts by weight, comprises:
boron oxide: 3-8 parts;
sodium oxide: 1.5-4.5 parts;
lithium oxide: 1.5-18 parts;
zirconium oxide: 15-45 parts;
aluminum oxide: 8-32 parts;
titanium dioxide: 1.5-7 parts.

An embodiment of the present invention provides a display structure forming material, comprising an alkaline soluble resin, an unsaturated monomer, an initiator, a solvent, and the above functional material.

In one embodiment, the display structure forming material is a photoresist, the photoresist further containing a colorant.

For example, the photoresist, based on parts by weight, comprises:
a functional material: 0.2-1.2 parts;
a colorant: 2-15 parts;
an alkaline soluble resin: 2-20 parts;
an unsaturated monomer: 2-20 parts;
an initiator: 0.01-1 parts;
a solvent: 30-90 parts;
an additive: 0.005-0.02 parts.

For example, the photoresist is any one of a red photoresist, a blue photoresist, a green photoresist, a yellow photoresist, and a black photoresist.

In one embodiment, the display structure forming material is a padding material.

For example, the padding material, based on parts by weight, comprises:
a functional material: 0.2-1.2 parts;
an alkaline soluble resin: 5-20 parts;
an unsaturated monomer: 5-20 parts;
an initiator: 0.01-1 parts;
a solvent: 30-90 parts;
an additive: 0.005-0.02 parts.

For example, the initiator is a photoinitiator or a thermal initiator.

An embodiment of the present invention provides a display structure forming material which is a protective layer material. The protective layer material, based on parts by weight, comprises:
a functional material: 0.2-1.2 parts;
an acrylic resin: 5-25 parts;

an coupling agent: 1-15 parts;
an epoxy resin: 1-20 parts;
a solvent: 70-80 parts.

An embodiment of the present invention provides a color film substrate comprising multiple display structures, and at least one of the display structures are prepared by the above display structure forming materials.

An embodiment of the present invention provides a display device comprising the above color film substrate.

For example, the display device is any one of a computer display, a television, a mobile phone, a tablet computer, a notebook computer, a digital camera, an electronic paper, and a navigator.

An embodiment of the present invention further provides a method of preparing the above functional material, comprising:

grinding and mixing each component with the use of a dispersant to obtain the inorganic mixed powder.

In one embodiment, the grinding and mixing comprise: grinding each component, respectively, followed by mixing them; or mixing each component followed by grinding them.

The preparation method further comprises: forming the surface modified layer on the inorganic mixed powder after obtaining the inorganic mixed powder.

For example, the forming the surface modified layer on the inorganic mixed powder comprises:

Step S1: mixing the inorganic mixed powder, the organic anhydride, the polymerizable vinylated unsaturated monomer with the solvent and the initiator to incur a reaction;

Step S2: obtaining the functional material after the reaction is complete.

For example, the step S1 comprises:

Step S11: at room temperature, charging the inorganic mixed powder into a reaction container with continuous stirring, followed by adding the solvent, the organic anhydride, at least a portion of the polymerizable vinylated unsaturated monomer into the reaction container and mixing them uniformly;

Step S12: adding dropwise the initiator into the reaction container to initiate the reaction.

For example, the polymerizable vinylated unsaturated monomer added in the step S11 comprises ⅔ to ¾ of the total amount of the polymerizable vinylated unsaturated monomer.

In the step S12, the initiator is mixed with the remaining polymerizable vinylated unsaturated monomer prior to adding dropwise to the reaction container.

For example, the reaction in the step S1 comprises two stages, wherein:

A first stage comprises reacting at a temperature of 35-40° C. for 60-90 min,

A second stage comprises reacting at a temperature of 60-70° C. for 60-80 min.

For example, the reaction in the step S1 is carried out under the protection of inert atmosphere.

For example, the step S2 comprises: cooling the reaction solution with continuous stirring until the crystal in the reaction solution is completely precipitated, and drying the crystal under reduced pressure to yield the functional material.

For example, the temperature of cooling is 0-10° C.

For example, the initiator is an azo initiator.

For example, the inorganic mixed powder, the organic anhydride, and the polymerizable vinylated unsaturated monomer are in a weight ratio of 1:(0.8-1.2):(0.85-1.15), and the inorganic mixed powder, the initiator, and the solvent are in a mass ratio of 1:(0.25-0.4):(1-1.5).

BRIEF DESCRIPTION OF THE DRAWINGS

For the sake of more clearly explaining the technical solutions of the examples of the present invention, the drawings of the examples will be simply introduced below, and it is apparent that the drawings in the following description merely relate to some examples of the present invention, rather than limiting the present invention.

DETAILED DESCRIPTION OF INVENTION

Figure 1:
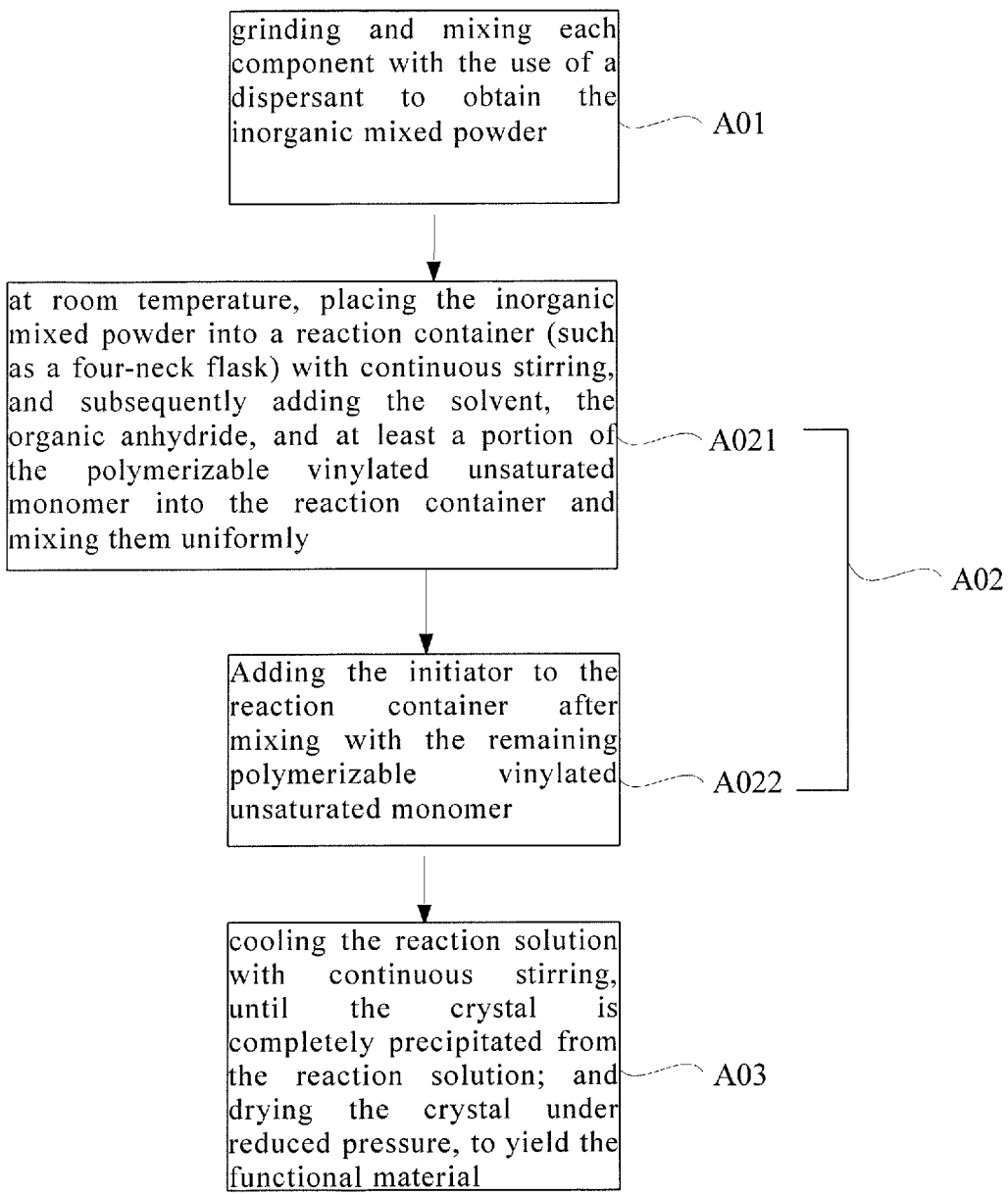
FIG. 1 is a flow diagram of a method of preparing a functional material according to an embodiment of the present invention.

To enable the skilled in the art to have a better understanding of the technical solution of the present invention, the present invention will be further detailedly described in combination with the drawings and specific embodiments below. It is obvious that the described examples are a portion rather than all of the examples of the present invention. All of the other examples obtained by the skilled in the art without needing to pay creative labor, based on the described examples of the present invention, are encompassed by the present invention.

An embodiment of the present invention provides a functional material comprising inorganic mixed powder, the inorganic mixed powder comprising a main material and an auxiliary material:

The main material comprises boron oxide, sodium oxide, lithium oxide, and zirconium oxide.

The auxiliary material comprises any one or more of aluminum oxide, zinc oxide, titanium dioxide, silicon dioxide, calcium oxide, silver complex, silver phosphate, silver nitrate, tourmaline, silver thiosulfate, carbon nanotube, aluminum sulfate, manganese, oxides of manganese, iron, oxides of iron, cobalt, oxides of cobalt, nickel, oxides of nickel, chromium, oxides of chromium, copper, oxides of copper, magnesium oxide, boron carbide, silicon carbide, titanium carbide, zirconium carbide, tantalum carbide, molybdenum carbide, boron nitride, chromium nitride, titanium nitride, zirconium nitride, aluminum nitride, chromium boride, trichromium tetraborate, titanium boride, zirconium boride, tungsten disilicide and titanium disilicide.

The functional material according to the embodiment of the present invention comprises inorganic mixed powder having the functions of producing negative ions and emitting far infrared rays with a high radiation rate. Therefore, when adding it into a display structure, the produced negative ions thereof can purify the air and improve the quality of the air, while the emitted far infrared rays are beneficial to the health of the human body and able to improve the immunity of the human body.

According to one preferred embodiment of the present invention, the inorganic mixed powder further comprises an addition material comprising any one or more of graphite, mica, indigo stone, calcite, crystal fluorite, maifanite, and mullite.

The performance of the functional material can be further improved by adding the above addition material powder to the inorganic mixed powder.

According to one preferred embodiment of the present invention, the addition material is in an amount of 1-5% of the total weight of the main material and the auxiliary material.

According to one preferred embodiment of the present invention, the inorganic mixed powder has a particle diameter between 20-300 nm.

According to one preferred embodiment of the present invention, the inorganic mixed powder has a surface modified layer formed by a light curable alkaline soluble resin having a molecular weight less than or equal to 5000 and greater than or equal to 2500. For example, the surface modified layer is formed by copolymerization of a polymerizable vinylated unsaturated monomer and an organic anhydride. For example, the polymerizable vinylated unsaturated monomer is any one of styrene, vinyl toluene, p-chloro styrene, methoxy styrene, α-methyl styrene, and isoprene, most preferably styrene; and the organic anhydride is any one of maleic anhydride, cis-butenedioic anhydride, Fumaric Anhydride, itaconic anhydride, citraconic anhydride, pyromellitic dianhydride, biphenyltetracarboxylic dianhydride, benzophenonetetracarboxylic dianhydride, oxygen biphenyltetracarboxylic dianhydride, and isopropyl diphthalic anhydride. In one preferred embodiment, the inorganic mixed powder, the organic anhydride, and the polymerizable vinylated unsaturated monomer are in a weight ratio of 1:(0.8-1.2):(0.85-1.15).

Although the functional material of the present invention has the above effect, the inorganic mixed powder therein belongs to inorganic substances. However, most of the display structures are organic substances. Thus, it is difficult for the inorganic mixed powder to be well compatible with the substrate of the display structure, thereby possibly influencing the performance of the display structure. To avoid this problem, an embodiment of the present invention forms a surface modified layer covering inorganic mixed powder on the surface of the powder, to allow well dispersion and integration of the inorganic mixed powder into the display structure, wherein the surface modified layer can be a layer formed by a light curable alkaline soluble resin having a molecular weight from 2500 to 5000, and preferably a layer of copolymer formed by a polymerizable vinylated unsaturated monomer and an organic anhydride.

According to one preferred embodiment of the present invention, the inorganic mixed powder, based on parts by weight, has the following amounts of the main material and the auxiliary material: boron oxide: 1.5-10 parts; sodium oxide: 0.5-5 parts; lithium oxide: 0.2-20 parts; zirconium oxide: 10-50 parts; aluminum oxide: 5-40 parts; titanium dioxide: 0.5-8 parts; and more preferably, boron oxide: 3-8 parts; sodium oxide: 1.5-4.5 parts; lithium oxide: 1.5-18 parts; zirconium oxide: 15-45 parts; aluminum oxide: 8-32 parts; titanium dioxide: 1.5-7 parts.

It has been found after study that the inorganic mixed powder having the above amounts of the main material and the auxiliary material (which may further contain other addition materials) has better conductivity and thermal stability, thereby improving the conductivity and thermal stability of the display structure.

An embodiment of the present invention provides a display structure forming material which comprises the above functional material.

Herein, the term "display structure" refers to the structure having a certain function in the display device, such as a color filter film, a black matrix, a padding substance and a protective layer. The term "display structure forming material" is usually in a form of fluid or semi-fluid, which can be coated onto the substrate, followed by forming the above display structures through curing, patternization process and the like.

The display structure forming material of the embodiment of the present invention comprises the above functional material, and thus it can produce negative ions, improve production environment, purify the air and improve the quality of the air during the use. Also, the prepared display structure can emit far infrared rays, which is beneficial to the health of the human body and improves the immunity of the human body.

In particular, the display structure forming material of the embodiment of the present invention can comprise an alkaline soluble resin, an unsaturated monomer, an initiator, a solvent, and the above functional material.

According to one embodiment of the present invention, the display structure forming material is a photoresist, the photoresist further containing a colorant.

Herein, the photoresist is a material for forming a color filter film or a black matrix, and it can form a color filter film with different colors (such as red, blue, green, and yellow) or a black matrix (black).

For example, the photoresist is any one of a red photoresist, a blue photoresist, a green photoresist, a yellow photoresist, and a black photoresist. The photoresists of the above colors correspond to conventional colors of color filter films and of black matrix, but it should be understood that the photoresist also comprises other colors such as cyan.

For example, the photoresist, based on parts by weight, comprises: a functional material: 0.2-1.2 parts; a colorant: 2-15 parts; an alkaline soluble resin: 2-20 parts; an unsaturated monomer: 2-20 parts; an initiator: 0.01-1 parts; a solvent: 30-90 parts; an additive: 0.005-0.02 parts.

Herein, the colorant of the photoresist may be selected according to the difference in colors of the photoresist.

For example, for a red photoresist, the colorant material thereof may be one or several selected from a group consisting of an orange pigment, a red pigment, a yellow pigment, an orange dye, a red dye, and a yellow dye, wherein the orange pigment may be selected from a group consisting of P.O.5, P.O.13, P.O.16, P.O.34, P.O.36, P.O.48, P.O.49, P.O.71, or P.O.73; the yellow pigment may be selected from a group consisting of P.Y.1, P.Y.12, P.Y.3, P.Y.13, P.Y.83, P.Y.93, P.Y.94, P.Y.95, P.Y.109, P.Y.126, P.Y.127, P.Y.138, P.Y.139, P.Y.147, P.Y.150, P.Y.174, or P.Y.180; the red pigment may be selected from a group consisting of P.R.122, P.R.123, P.R.177, P.R.179, P.R.190, P.R.202, P.R.210, P.R.224, P.R.254, P.R.255, P.R.264, P.R.270, P.R.272, or P.R.122; and the dye may be selected from a group consisting of C.I. Basic Yellow 2, C.I. Solvent Yellow 34, C.I. Basic Orange 2, Y-27, Y-44, Y-50, Y-86, Y-106, Y-120, Y-132, Y-6, Y-11, Y-119, Y-23, Y-4, C.I. Direct R80, C.I. Direct R83, C.I. Solvent R49, C.I. Solvent RSB, C.I. Solvent R49, R-80, R-81, R-83, R-239, R-254, R-153, R-135, R-74.

For a green photoresist, the colorant material thereof may be one or several selected from a group consisting of a green pigment, a yellow pigment, a green dye, and a yellow dye, wherein, in the formulation, the green pigment may be selected from a group consisting of: P.G.37, P.G.36, P.G.7; the yellow pigment may be selected from a group consisting of: P.Y.1, P.Y.12, P.Y.3, P.Y.13, P.Y.83, P.Y.93, P.Y.94, P.Y.95, P.Y.109, P.Y.126, P.Y.127, P.Y.138, P.Y.139, P.Y.147, P.Y.150, P.Y.174, P.Y.180; and the yellow, green dyes may be selected from a group consisting of: C.I. Basic Yellow 2, C.I. Solvent Yellow 34, C.I. Solvent Green 1, Y-27, Y-44, Y-50, Y-86, Y-106, Y-120, Y-132, Y-6, Y-11, Y-119, Y-23, Y-4, G-26, C.I. Direct G59, C.I. Direct G34.

For a blue photoresist, the colorant material thereof may be one or several selected from a group consisting of a blue pigment, a purple pigment and a blue dye, wherein, the blue pigment may be selected from a group consisting of: P.B.1, P.B.2, P.B.15, P.B.15: 3, P.B.15: 4, P.B.15: 6, P.B.16, P.B.22, P.B.60, or P.B.66; the purple pigment may be selected from a group consisting of: P.V.32, P.V.36, P.V.38, P.V.39, P.V. 23, P.V.9, P.V.1; the blue dye may be selected from a group consisting of: C.I. Direct Blue 288, C.I. Direct Blue93, C.I. Direct Blue 116, C.I. Direct Blue 148, C.I. Direct Blue 149, C.I. Direct Blue 150, C.I. Direct Blue 159, C.I. Direct Blue 162 or C.I. Direct Blue 163.

For a yellow photoresist, the colorant material thereof may be one or several selected from a group consisting of a yellow pigment, a yellow dye, an orange pigment and an orange dye, wherein, the orange pigment may be selected from a group consisting of: P.O.5, P.O.13, P.O.16, P.O.34, P.O.36, P.O.48, P.O.49, P.O.71, P.O.73; the yellow pigment may be selected from a group consisting of: P.Y.1, P.Y.12, P.Y.3, P.Y.13, P.Y.83, P.Y.93, P.Y.94, P.Y.95, P.Y.109, P.Y.126, P.Y.127, P.Y.138, P.Y.139, P.Y.147, P.Y.150, P.Y.174, or P.Y.180; and the yellow, orange dyes may be selected from a group consisting of: C.I. Basic Yellow 2, C.I. Solvent Yellow 34, C.I. Basic Orange 2, Y-27, Y-44, Y-50, Y-86, Y-106, Y-120, Y-132, Y-6, Y-11, Y-119, Y-23, Y-4.

For a black photoresist, the colorant material thereof may be one or several selected from a group consisting of a carbon black pigment, an organic black pigment, and a black dye, wherein the carbon black pigment may be selected from a group consisting of Degussa Carbon black P series: Printex L6, Printex 25, Printex L, Printex55, Printex 45, Printex 60, Printex 35, Printex 200; Special Black series: Special Black 550, Special Black 350, Special Black 250, Special Black 100; H series: Hiblack 30, Hiblack 30L; Columbia Carbon black series: Raven 1255, Raven 1200, Raven 1170, Raven 1100 Ultra, Raven 1060 Ultra, Raven 1040, Raven 1035, Raven 1020, Raven 1000, Raven 890, Raven 860 Ultra, Raven 850, Raven 820, Raven 760 Ultra, Raven 460, Raven 450, Raven 410, Raven H2O, Raven 825 OB, Raven 680 OB; CABOT series: R99R, R250R, R330R, R400R, R660R, ML, DL430; the organic black pigment may be selected from a group consisting of Perylenes black pigment, BASF black series: L0080, L0086, CCA1, CCA2 from the Nippon Synthetic Chemical Industry Co. Ltd.; the black dye may be selected from a group consisting of Direct Black series: 19, 22, 154, 168, dye11, dye12, dye13, dye14, dye15, dye16, dye17.

Herein, the alkaline soluble resin can be selected from a group consisting of aromatic acid acrylic half ester, or a copolymer of styrene and organic anhydride, etc.

Herein, the unsaturated monomer can be one or several selected from a group consisting of vinyl chloride, styrene, methyl methacrylate, maleimide, butadiene, methyl acrylate, epoxy acrylate, bisphenol A epoxy methyl acrylate, DPHA (dipentaerythritol pentaacrylate), EBE264, EBE 350.

Herein, the initiator is preferably a photoinitiator or a thermal initiator. For example, the photoinitiator can be selected from a group consisting of α-amido ketones photo-initiator: Irgacure 907, Igracure369, Irgacure1300; acylphosphine oxide photo-initiator: Irgacure819, Irgacure819DW, Irgacure2010, Darocur TPO, Darocur4265; α-hydroxyl ketones photo-initiator: Darocur1173, Irgacure184, Irgacure2959, Irgacure500, Irgacure1000; benzoylformates photo-initiator: Darocur mbf, Irgacure754; O-acyl-oxime esters photo-initiator: OXE-01, OXE-02, Quanta cure PDO; benzoylformates photo-initiator: ITX, MBF, Irgacure754. And, the thermal initiator can be selected from a group consisting of (2,5-dimethyl-2,5-di(tert-butylperoxy)-3-hexyne), (2,5-dimethyl-2,5-di(tert-butylperoxy) hexane), sodium peroxydisulfate, potassium peroxydisulfate, ammonium peroxydisulfate, 2,2'-azobis(2-amidinopropane)dihydrochloride, and 2,2'-azobis(2-(2-imidazolin-2-yl)propane)dihydrochloride.

Herein, the solvent can be selected from a group consisting of a basic solvent: ketone, ester, ether, certain aromatic hydrocarbon solvents; a neutral solvent: aliphatic hydrocarbon, cycloalkane compounds, certain aromatic hydrocarbon solvents, and the like. For example, the solvent can be one or more of fatty alcohol, ethylene glycol ether, ethyl acetate, methyl ethyl ketone, methyl isobutyl ketone, monomethyl ether ethylene glycol ester, gamma-butyrolactone, ethyl 3-ethoxy propionate, butyl carbitol, butyl carbitol acetate, propylene glycol monomethyl ether, propylene glycol monomethyl ether acetate (PGMEA), cyclohexane, xylene, and isopropyl alcohol. Here, propylene glycol monomethyl ether, propylene glycol monomethyl ether acetate, cyclohexane, butyl carbitol, butyl carbitol acetate and gamma-butyrolactone are preferred.

Herein, the additive is one commonly used in the display structure forming material, which comprises, but is not limited to, a wetting and adhesion promoting agent, a levelling agent, a defoaming agent, a light stabilizer, etc.

According to one embodiment of the present invention, the display structure forming material is a padding material.

Herein, the "padding material" refers to a material for forming the "padding" which is used to support two oppositely disposed substrates of the display device (such as a liquid crystal display device).

For example, the padding material, based on parts by weight, comprises the functional material: 0.2-1.2 parts; a alkaline soluble resin: 5-20 parts; an unsaturated monomer: 5-20 parts; an initiator: 0.01-1 part; a solvent: 30-90 parts; an additive: 0.005-0.02 parts.

Herein, the alkaline soluble resin, the unsaturated monomer, the initiator, the solvent, and the additive are selected as described above.

According to one embodiment of the present invention, the display structure forming material is a protective layer material which, based on parts by weight, comprises the functional material: 0.2-1.2 parts; an acrylic resin: 5-25 parts; an coupling agent: 1-15 parts; an epoxy resin: 1-20 parts; a solvent: 70-80 parts.

Herein, the acrylic resin can be selected from a group consisting of methyl acrylate, ethyl acrylate, methyl 2-methacrylate, ethyl 2-methacrylate, polyester acrylate, polyurethane acrylate, epoxy acrylate; the coupling agent can be selected from a group consisting of silane, nitrogenous silane, phenoxy silane, vinyl silane, amino silane, epoxy silane, mercapto silane, methyl acryloxyl silane, and the like. The epoxy resin can be selected from a group consisting of aliphatic epoxy resin, bisphenol A epoxy resin, glycidyl esters epoxy resin, heterocyclic epoxy resin, and the like. The solvent can be selected from a group consisting of a basic solvent: ketone, ester, ether, certain aromatic hydrocarbon solvents; a neutral solvent: aliphatic hydrocarbon, cycloalkane compounds, certain aromatic hydrocarbon solvents, and the like. For example, the solvent can be one or more of fatty alcohol, ethylene glycol ether, ethyl acetate, methyl ethyl ketone, N-methyl pyrrolidone, methyl isobutyl ketone, monomethyl ether ethylene glycol ester, gamma-butyrolactone, ethyl 3-ethoxy propionate, butyl carbitol, butyl carbitol acetate, propylene glycol monomethyl ether, propylene glycol monomethyl ether acetate (PGMEA), cyclohexane, xylene, and isopropyl alcohol, wherein, propylene glycol monomethyl ether, propylene glycol monomethyl ether acetate, cyclohexane, butyl carbitol, butyl carbitol acetate and gamma-butyrolactone are preferred.

An embodiment of the present invention also provides a color film substrate comprising multiple display structures, at least one of which is prepared by the above display structure forming material.

Here, the color film substrate usually comprises a substrate (such as a glass substrate), a black matrix formed on the substrate, a color filter film of different colors formed at the gaps of the black matrix, a protective layer and an electrode layer successively formed on the color filter film, and a padding formed on the electrode layer.

According to the difference of the selected display structure forming material, the display structure can be a color filter film, a black matrix, a padding, a protective layer, etc.

The display structure of the embodiment of the present invention is formed by the display structure forming material described above, which therefore can produce negative ions, improve production environment, purify the air and improve the quality of the air during the preparation process. Also, the display structure can emit far infrared rays, which is beneficial to the health of the human body and improves the immunity of the human body.

Certainly, it should be understood that the display structure prepared by the display structure forming material of the embodiment of the present invention is not limited to be used on the color film substrate. For example, the display structure can also be used to form other display structures on an array substrate and the like.

An embodiment of the present invention provides a display device comprising the above color film substrate.

Certainly, in addition to the color film substrate, the display device may also comprise other known structures such as an array substrate, which are no longer detailedly described herein.

The display device of the embodiment of the present invention comprises the above color film substrate, and it therefore can produce negative ions, improve production environment, purify the air and improve the quality of the air during the preparation process. Meanwhile, it can also emit far infrared rays, which is beneficial to the health of the human body and improves the immunity of the human body.

According to one embodiment of the present invention, the display device is any one of a computer display, a television, a mobile phone, a tablet computer, a notebook computer, a digital camera, an electronic paper, and a navigator.

For example, the above display device can be of various types, such as, a liquid crystal display device, an organic light emitting diode display device, and the like.

An embodiment of the present invention provides a method for preparing the above functional material, as shown in FIG. 1, which comprises the steps of:

A01. grinding and mixing each component with the use of a dispersant to obtain the inorganic mixed powder.

Herein, in order to make the functional material better compatible with display structure, it is preferable to make the inorganic mixed powder have a smaller particle diameter through grinding raw materials during the preparation of the inorganic mixed powder. Meanwhile, a dispersant is also used in this process to disperse the inorganic mixed powder without causing agglomeration. It needs to explain that, a small amount of the dispersant is used for the purpose of making the inorganic mixed powder well dispersed, but without changing the composition of the functional material product. Herein, the dispersant selected for use in the embodiment of the present invention is a neutral dispersant. For example, it can be one or several of a wetting dispersant BYK 161, LUBRIZOL Solsperse 32500, and Solsperse 22000.

According to one preferred embodiment of the present invention, the above grinding and mixing can comprise grinding each component, respectively, and mixing them together; and can also comprise mixing each component together followed by grinding them.

That is to say, each component of this step can be taken in proportion and then homogeneously grinded and dispersed, directly resulting in the above inorganic mixed powder. Alternatively, as another manner of this embodiment, each component can also be ground and dispersed, and then the powders of different raw materials are mixed together in proportion. The process of grinding and mixing used therein may be determined according to the difference in the specific surface area of each component. If the specific surface area of each component has little difference, a process of uniform dispersion and grinding may be used, while if the specific surface area of each component has large difference (for example, the component containing tourmaline, jade, bamboo carbon fiber materials and the like), they may be ground, respectively, followed by mixing.

Preferably, when the inorganic mixed powder is provided with the surface modified layer described above thereon, the preparation method further comprises the step of forming the surface modified layer on the surface of the inorganic mixed powder, comprising:

A02. The step of forming the surface modified layer can comprise: mixing the inorganic mixed powder, an organic anhydride, a polymerizable vinylated unsaturated monomer with a solvent and an initiator to incur a reaction.

That is to say, each component of the above functional material, an organic anhydride, a polymerizable vinylated unsaturated monomer are mixed with a solvent and an initiator to form a reaction solution, thereby forming a surface modified layer on the surface of the inorganic mixed powder.

For example, the initiator is an azo initiator, such as azobisisovaleronitrile, azobisisobutyronitrile, and azobisisoheptonitrile, most preferably azobisisoheptonitrile.

For example, the inorganic mixed powder, the initiator, and the solvent are in a weight ratio of 1:(0.25-0.4):(1-1.5). The inorganic mixed powder, the organic anhydride, and the polymerizable vinylated unsaturated monomer are in a weight ratio of 1:(0.8-1.2):(0.85-1.15).

Herein, each component can be directly mixed together. However, to avoid too violent reaction, this step preferably comprises:

A021. at room temperature, placing the inorganic mixed powder into a reaction container (such as a four-neck flask) with continuous stirring, and subsequently adding the solvent, the organic anhydride, and at least a portion of the polymerizable vinylated unsaturated monomer into the reaction container and mixing them uniformly.

Herein, the term "room temperature" means that in this step, it is not necessary to particularly control the temperature of the reaction container, as long as it remains close to the environmental temperature. In general, "room temperature" can be considered to be 20-30° C.

Herein, the inorganic mixed powder is stirred in order to prevent agglomeration of the inorganic mixed powder to influence the range of the particle diameter of the product.

Herein, the expression "at least a portion of the polymerizable vinylated unsaturated monomer" means that the polymerizable vinylated unsaturated monomer may not be added totally in this step, but only a portion thereof will be added, and the remaining polymerizable vinylated unsaturated monomer may be added in the next step together with the initiator.

For example, the polymerizable vinylated unsaturated monomer added in this step comprises from ⅔ to ¾ of the total amount of the polymerizable vinylated unsaturated monomer.

A022. Adding dropwise the initiator to the reaction container for carrying out the reaction.

Herein, if only a portion of the polymerizable vinylated unsaturated monomer is added previously, the initiator will be added to the reaction container after mixing with the remaining polymerizable vinylated unsaturated monomer.

Herein, since the initiator is used in this step in a very small amount for the purpose of catalyzing the reaction, it is added after mixing with the polymerizable vinylated unsaturated monomer and in a manner of adding dropwise. The above measures can better avoid violent reaction of the reaction solution, and prevent the catalyst added to the reaction container from causing local solution oversaturation due to unavailable dispersion to produce a precipitate with poor purity.

Preferably, the reaction in this step includes two stages: a first stage comprises reacting at 35-40° C. for 60-90 min; and a second stage comprises reacting at 60-70° C. for 60-80 min.

In the first stage, the catalyst needs to be slowly added to the reaction solution with continuous stirring at a low temperature so as to avoid too violent reaction. After the catalyst is gradually reacted, the reaction enters into the second stage, and at this time the temperature may be increased and the reaction continues. It should be understood that the reaction time of the second stage may be determined according to the molecular weight of the required product. If the required product has a large molecular weight, the reaction time may be longer than 60 min.

For example, the reaction is conducted under the protection of an inert atmosphere to prevent disturbance of oxygen gas to the reaction, wherein, the inert atmosphere can be, for example, nitrogen gas atmosphere, and can also be other atmosphere of inert gas such as argon gas.

A03. Separating the functional material after the reaction is completed.

That is to say, the inorganic mixed powder with the surface modified layer is separated from the reaction solution as a functional material product.

For example, this step can comprise: cooling the reaction solution with continuous stirring, until the crystal is completely precipitated from the reaction solution; and drying the crystal under reduced pressure, to yield the functional material.

In this step, when the reaction is completed, the reaction solution in the reaction container is cooled by reducing the temperature thereof and purified using a crystallization process to allow the functional material in the reaction solution to precipitate as a crystal due to the reduced solubility and the unreacted materials or other components to remain in the solution. The crystal is subsequently dried under reduced pressure to give a pure functional material.

Herein, the cooling operation is usually conducted at a temperature within a range of 0-10° C.

An embodiment of the present invention provides a method of preparing a functional material, in which the raw materials used are widely available. The preparation process is simple and easy to perform, and the functional material prepared by the preparation process can be well mixed with the components.

Figure 2:
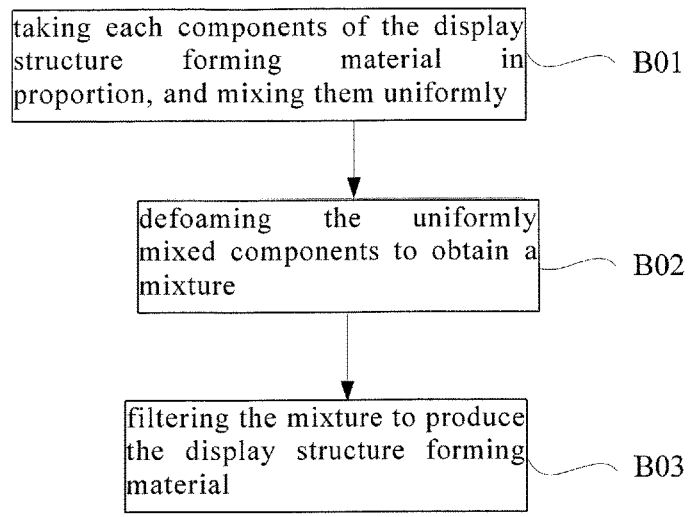
FIG. 2 is a flow diagram of a method of preparing a display structure forming material according to an embodiment of the present invention.

Corresponding to the above display structure forming material, an embodiment of the present invention also provides a method of preparing the display structure forming material, as shown in FIG. 2, comprising the steps of:

B01. taking each components of the display structure forming material in proportion, and mixing them uniformly.

Herein, the content of each component may be determined according to the display structure prepared by the display structure forming material.

For the display structure forming material as a photoresist, it comprises, based on parts by weight: the functional material: 0.2-1.2 parts; the colorant: 2-15 parts; the alkaline soluble resin: 2-20 parts; the unsaturated monomer: 2-20 parts; the initiator: 0.01-1 parts; the solvent: 30-90 parts; the additive: 0.005-0.02 parts. Preferably, the photoresist comprises, based on parts by weight: the functional material: 0.5-1.2 parts; the colorant: 5-15 parts; the alkaline soluble resin: 5-20 parts; the unsaturated monomer: 5-20 parts; the initiator: 0.01-1 parts; the solvent: 40-90 parts; the additive: 0.005-0.015 parts. More preferably, the photoresist comprises, based on parts by weight: the functional material: 0.5-1.0 parts; the colorant: 5-10 parts; the alkaline soluble resin: 5-15 parts; the unsaturated monomer: 5-15 parts; the initiator: 0.01-1 parts; the solvent: 45-90 parts; the additive: 0.005-0.01 parts.

For the display structure forming material as a padding material, it comprises, based on parts by weight: the functional material: 0.2-1.2 parts; the alkaline soluble resin: 5-20 parts; the unsaturated monomer: 5-20 parts; the initiator: 0.01-1 parts; the solvent: 30-90 parts; the additive: 0.005-0.02 parts. Preferably, the padding material comprises, based on parts by weight: the functional material: 0.5-1.2 parts: alkaline soluble resin: 10-20 parts; the unsaturated monomer: 10-20 parts; the initiator: 0.01-1 parts; the solvent: 40-90 parts; the additive: 0.005-0.015 parts. More preferably, the padding material comprises, based on parts by weight: a functional material: 0.5-1.0 parts; the alkaline soluble resin: 10-15 parts; the unsaturated monomer: 10-15 parts; the initiator: 0.01-1 parts; the solvent: 45-90 parts; the additive: 0.005-0.01 parts.

For the display structure forming material as a protective layer material, it comprises, based on parts by weight: the functional material: 0.2-1.2 parts; the acrylic resin: 5-25 parts; the coupling agent: 1-15 parts; the epoxy resin: 1-20 parts; the solvent: 70-80 parts. Preferably, the protective layer material comprises, based on parts by weight: the functional material: 0.5-1.2 parts; the acrylic resin: 5-20 parts; the coupling agent: 1-10 parts; the epoxy resin: 1-15 parts. More preferably, the protective layer material comprises, based on parts by weight: the functional material: 0.5-1.0 parts; the acrylic resin: 5-15 parts; the coupling agent: 1-8 parts; the epoxy resin: 1-10 parts.

B02. defoaming the uniformly mixed components to obtain a mixture.

In this step, the components uniformly mixed in the last step are defoamed to remove the gas bubbles in the raw materials, making the raw materials uniformly mixed and dispersed. For example, defoaming is conducted for two to three times, and the defoaming time is 30 to 50 min each time.

It should be understood that the examples of the present invention are not limited thereto, and the skilled in the art can determine or adjust the defoaming times or duration according to the disclosure of the present invention as well as common knowledge or common technical means in the art.

B03. filtering the mixture to produce the display structure forming material.

The insoluble substances of the mixture are removed in this step, so as to make the display structure forming material smooth and fine as a whole.

An embodiment of the present invention provides a method of preparing the display structure forming material, of which the steps are simple and easy to perform.

Figure 3:
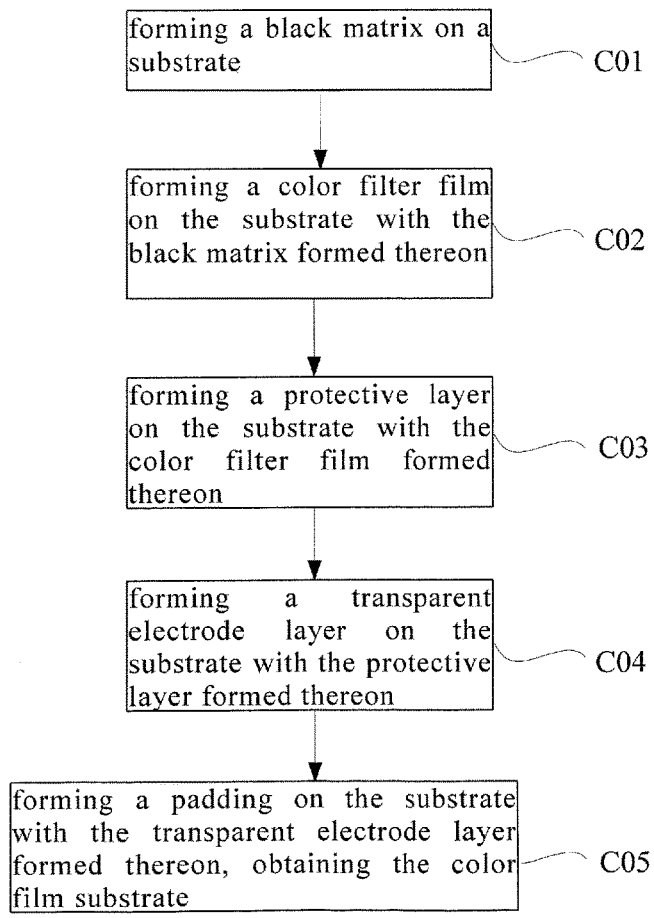
FIG. 3 is a flow diagram of a method of preparing a color film substrate according to an embodiment of the present invention.

As shown in FIG. 3, an embodiment of the present invention provides a method of preparing a color film substrate, comprising the steps of:

C01. forming a black matrix on a substrate;

C02. forming a color filter film on the substrate with the black matrix formed thereon, the color filter film being located at the gaps of the black matrix, and comprising many different colors (such as red, green, blue, yellow);

C03. forming a protective layer on the substrate with the color filter film formed thereon;

C04. forming a transparent electrode layer on the substrate with the protective layer formed thereon;

C05. forming a padding on the substrate with the transparent electrode layer formed thereon, obtaining the color film substrate.

Herein, one or more of the black matrix, the color filter film, the protective layer, and the padding can be prepared using the above display structure forming material.

EXAMPLES

For the purpose of better illustration of the present invention, it will be illustrated below with specific examples in detail, wherein, Examples 1-9 detailedly illustrate the functional material, and Examples 10-24 detailedly illustrate the display structure as well as its formation.

Herein, Examples 1 to 9 are shown in Tables 1 to 5.

TABLE 1

Introduction of the main material in the functional materials of Examples 1-9 (the amounts are in parts by weight)

| Example | amount of boron oxide | amount of sodium oxide | amount of lithium oxide | amount of zirconium oxide |
| --- | --- | --- | --- | --- |
| 1 | 1.5 | 0.8 | 0.57 | 10 |
| 2 | 1.7 | 1.0 | 2.5 | 15 |
| 3 | 3.83 | 1.83 | 6.73 | 20 |
| 4 | 5.18 | 2.27 | 8.16 | 25 |
| 5 | 6.5 | 3.6 | 10.5 | 30 |
| 6 | 7.17 | 3.6 | 10.5 | 30 |
| 7 | 7.9 | 3.6 | 10.5 | 35 |
| 8 | 8.5 | 3.6 | 15.5 | 40 |
| 9 | 9.18 | 4.58 | 17.08 | 45 |

TABLE 2

Introduction of the auxiliary material in the functional materials of Examples 1-9 (the amounts are in parts by weight)

| Ex. | auxiliary material 1 | auxiliary material 1, amount | auxiliary material 2 | auxiliary material 2, amount | auxiliary material 3 | auxiliary material 3, amount | auxiliary material 4 | auxiliary material 4, amount | auxiliary material 5 | auxiliary material 5, amount |
| --- | --- | --- | --- | --- | --- | --- | --- | --- | --- | --- |
| 1 | aluminum oxide | 15 | titanium dioxide | 2.83 | none | none | none | none | none | none |
| 2 | aluminum oxide | 15 | titanium dioxide | 2.83 | silicon dioxide | 34.81 | ferric oxide | 10.18 | magnesium oxide | 4.7 |
| 3 | silicon dioxide | 40 | manganese oxide | 1.2 | calcium oxide | 0.98 | none | none | none | none |
| 4 | silicon dioxide | 40 | aluminum nitride | 15 | silver phosphate | 3 | magnesium oxide | 4 | none | none |
| 5 | silicon dioxide | 40 | nickel oxide | 1.4 | chromium oxide | 1.4 | none | none | none | none |
| 6 | aluminum oxide | 10 | magnesium oxide | 10 | zinc oxide | 10 | silicon dioxide | 30 | none | none |
| 7 | carbon nanotube | 30 | titanium boride | 3 | zirconium boride | 1 | silicon carbide | 10 | none | none |
| 8 | carbon nanotube | 30 | titanium nitride | 3 | zirconium nitride | 1 | silicon carbide | 10 | none | none |
| 9 | silicon carbide | 25 | magnesium oxide | 5 | zinc oxide | 2 | cobalt oxide | 1 | nickel oxide | 1 |

TABLE 3

Introduction of the addition material in the functional materials of Examples 1-9 (in a percent of the total amount of the main material and auxiliary material)

| Ex. | addition material 1 | addition material 1, percent | addition material 2 | addition material 2, percent | addition material 3 | addition material 3, percent |
| --- | --- | --- | --- | --- | --- | --- |
| 1 | none | none | none | none | none | none |
| 2 | maifanite | 1.25 | none | none | none | none |
| 3 | maifanite | 1.25 | mullite | 1.25 | none | none |
| 4 | maifanite | 1.25 | mica | 1.25 | none | none |
| 5 | calcite | 1 | indigo stone | 1 | none | none |
| 6 | calcite | 1 | mica | 1 | crystal fluorite | 1 |
| 7 | graphite | 1 | mica | 1 | none | none |
| 8 | graphite | 1 | indigo stone | 1 | none | none |
| 9 | indigo stone | 1 | mullite | 1 | none | none |

TABLE 4

Conditions of the surface modified layers in the functional materials of Examples 1-9 (in a unit of weight parts)

| Ex. | inorganic mixed powder particle diameter (nm) | amount of inorganic mixed powder | polymerizable vinylated unsaturated monomer | amount of polymerizable vinylated unsaturated monomer | organic anhydride | amount of organic anhydride | solvent | amount of solvent | an initiator | amount of initiator |
|---|---|---|---|---|---|---|---|---|---|---|
| 1 | 30 | 1 | styrene | 0.9 | maleic anhydride | 0.8 | propylene glycol monomethyl ether acetate | 1 | azobisiso-valeronitrile | 0.24 |
| 2 | 50 | 1 | styrene | 1 | maleic anhydride | 1 | propylene glycol monomethyl ether acetate | 1 | azobisiso-valeronitrile | 0.24 |
| 3 | 80 | 1 | styrene | 1.05 | maleic anhydride | 1.1 | propylene glycol monomethyl ether acetate | 1 | azodiiso-butyronitrile | 0.3 |
| 4 | 100 | 1 | styrene | 1.15 | maleic anhydride | 1.2 | propylene glycol monomethyl ether acetate | 1 | azodiiso-butyronitrile | 0.3 |
| 5 | 120 | 1 | vinyl toluene | 1 | cis-butenedioic anhydride | 1 | propylene glycol monomethyl ether acetate | 1 | azobisiso-heptonitrile | 0.24 |
| 6 | 150 | 1 | p-chloro styrene | 1 | itaconic anhydride | 1 | propylene glycol monomethyl ether acetate | 1 | azobisiso-heptonitrile | 0.24 |
| 7 | 180 | 1 | methoxy styrene | 1 | pyromellitic dianhydride | 1 | propylene glycol monomethyl ether acetate | 1 | azobisiso-heptonitrile | 0.24 |
| 8 | 200 | 1 | α-methyl styrene | 1 | biphenyltetra-carboxylic dianhydride | 1 | propylene glycol monomethyl ether acetate | 1 | azobisiso-heptonitrile | 0.24 |
| 9 | 220 | 1 | isoprene | 1 | isopropyl diphthalic anhydride | 1 | propylene glycol monomethyl ether acetate | 1 | azobisiso-heptonitrile | 0.24 |

TABLE 5

The parameters of the preparation processes of the functional materials of Examples 1-9

| Example | Grinding manner | Addition manner of polymerizable vinylated unsaturated monomer | Heating temperature of first stage (° C.) | Heating time of first stage (min) | Heating temperature of second stage (° C.) | Heating time of second stage (min) | Cooling temperature (° C.) |
|---|---|---|---|---|---|---|---|
| 1 | mixing followed by grinding | adding all once | 35 | 60 | 60 | 60 | 0 |
| 2 | grinding followed by mixing | mixing and adding ⅓ thereof with the initiator | 38 | 70 | 60 | 70 | 0 |
| 3 | mixing followed by grinding | mixing and adding ⅔ thereof with the initiator | 38 | 80 | 70 | 70 | 0 |
| 4 | mixing followed by grinding | mixing and adding ¾ thereof with the initiator | 40 | 90 | 70 | 80 | 0 |
| 5 | mixing followed by grinding | adding all once | 35 | 60 | 60 | 60 | 0 |
| 6 | mixing followed by grinding | adding all once | 35 | 60 | 60 | 60 | 5 |
| 7 | mixing followed by grinding | adding all once | 35 | 60 | 60 | 60 | 5 |

TABLE 5-continued

The parameters of the preparation processes of the functional materials of Examples 1-9

| Example | Grinding manner | Addition manner of polymerizable vinylated unsaturated monomer | Heating temperature of first stage (° C.) | Heating time of first stage (min) | Heating temperature of second stage (° C.) | Heating time of second stage (min) | Cooling temperature (° C.) |
|---|---|---|---|---|---|---|---|
| 8 | mixing followed by grinding | adding all once | 35 | 60 | 60 | 60 | 8 |
| 9 | mixing followed by grinding | adding all once | 35 | 60 | 60 | 60 | 10 |

Nine different functional materials of Examples 1 to 9 are prepared using the components, amounts, preparation methods, preparation parameters, etc, of the above Tables 1 to 5. In the following Examples 10 to 24, each of the functional materials above is used in different display structure forming materials, and these display structure forming materials are prepared into corresponding display structures for testing the performance thereof.

Example 10

Preparation of a red photoresist 1, comprising:
Weighing, in parts by weight, 0.5 parts of a modified functional material (Example 3), 6 parts of a mixture of P.R.254 and P.Y.139 (available from DIC), 11 parts of aromatic acid acrylic half ester SB401, 4 parts of aromatic acid acrylic half ester SB404 (available from Sartomer), 7 parts of EBE 350 (available from Cytec Industries (shanghai) Co. Ltd.), 8 parts of DPHA, 29.868 parts of propylene glycol monomethyl ether acetate, 25.22 parts of ethyl 3-ethoxypropionate, 8.35 parts of n-butanol, 0.003 parts of Irgacure 369 (available from Irgacure), 0.009 parts of Darocur 1173 (available from Darocur), 0.02 parts of adhesion promotor A-186 (available from Dow Corning) and 0.03 parts of levelling agent BYK 333 (available from BYK), stirring and mixing them uniformly. Then, the above components after uniform mixing are defoamed twice, each for 35 minutes, to obtain a mixture. The resulting mixture is filtered for removal of impurities, to give a red photoresist 1.

The preparation of a color film substrate 1 comprises:
coating a black photoresist on a substrate to form a black matrix; then forming red, green, and blue color filter films successively on the regions of the substrate partitioned by the black matrix via processes such as pre-baking and curing, wherein the red color filter film is prepared by the red photoresist 1 of this Example; successively preparing a protective layer and a transparent electrode layer on the color filter film; and forming a padding on the electrode layer.

The performance tests are conducted on the color film substrate 1, and the results are as follows:

| | |
|---|---|
| Infrared ray specific radiance % | 50 |
| Negative ion (number/cubic centimeter) | 1045 |
| Transmittance | 92 |
| Color coordinate (x, y) | (0.635, 0.328) |
| E value | 1.2 |

Herein, specific method for each test and analysis of test results are uniformly described after Examples.

Example 11

Preparation of a red photoresist 2, comprising:
Firstly, weighing, in parts by weight, 0.66 parts of a modified functional material (Example 5), 6 parts of a mixture of P.R.254 and P.Y.139, 10 parts of aromatic acid acrylic half ester SB401, 5 parts of aromatic acid acrylic half ester SB404, 6 parts of EBE 350, 9 parts of DPHA, 29.548 parts of propylene glycol monomethyl ether acetate, 25.31 parts of ethyl 3-ethoxypropionate, 8.42 parts of n-butanol, 0.002 parts of Irgacure 369, 0.01 parts of ITX (an initiator, available from Ciba), 0.01 parts of adhesion promotor A-186 and 0.04 parts of levelling agent BYK 333, stirring and mixing them uniformly. Then, the above components after uniform mixing are defoamed twice, each for 35 minutes to obtain a mixture. The resulting mixture is filtered for removal of impurities, to give a red photoresist 2.

Preparation of a color film substrate 2, comprising:
Coating a black photoresist on a substrate to form a black matrix; forming red, green, and blue color filter films successively on the regions of the substrate partitioned by the black matrix via processes such as pre-baking and curing, wherein the red color filter film is prepared by the red photoresist 2 of this Example; successively preparing a protective layer and a transparent electrode layer on the color filter film; and forming a padding on the electrode layer.

The performance tests are conducted on the color film substrate 2, and the results are as follows:

| | |
|---|---|
| Infrared ray specific radiance % | 82 |
| Negative ion (number/cubic centimeter) | 1540 |
| transmittance | 90.3 |
| Color coordinate (x, y) | (0.625, 0.319) |
| E value | 1.1 |

Example 12

Preparation of a blue photoresist 3, comprising:
Weighing, in parts by weight, 0.45 parts of a modified functional material (Example 2), 6 parts of a mixture of P.B.15 and P.V.32, 12 parts of aromatic acid acrylic half ester SB401, 3 parts of aromatic acid acrylic half ester SB404, 10 parts of EBE 350, 5 parts of DPHA, 29.938 parts of propylene glycol monomethyl ether acetate, 25 parts of ethyl 3-ethoxypropionate, 8.55 parts of n-butanol, 0.007 parts of Irgacure 369, 0.005 parts of OXE-02, 0.02 parts of adhesion promotor A-186 and 0.03 parts of levelling agent BYK 333, stirring and mixing them uniformly. Then, the above components after uniform mixing are defoamed twice, each for 30 minutes to obtain a mixture. The resulting mixture is filtered for removal of impurities, to give a blue photoresist 3.

Preparation of a color film substrate 3, comprising:
Coating a black photoresist on a substrate to form a black matrix; forming red, green, and blue color filter films successively on the regions of the substrate partitioned by the black matrix via processes such as pre-baking and curing, wherein the blue color filter film is prepared by the blue photoresist 3 of this Example; successively preparing a protective layer and a transparent electrode layer on the color filter film; and forming a padding on the electrode layer.

The performance tests are conducted on the color film substrate 3, and the results are as follows:

| | |
|---|---|
| Infrared ray specific radiance % | 52 |
| Negative ion (number/cubic centimeter) | 801 |
| Transmittance | 85.6 |
| Color coordinate (x, y) | (0.144, 0.786) |
| E value | 2.2 |

Example 13

Preparation of a blue photoresist 4, comprising:

Weighing, in parts by weight, 0.66 parts of a modified functional material (Example 4), 6 parts of a mixture of P.B.15 and P.V.32 (available from Clariant), 10 parts of aromatic acid acrylic half ester SB401, 5 parts of aromatic acid acrylic half ester SB404, 6 parts of EBE 350, 9 parts of DPHA, 29.548 parts of propylene glycol monomethyl ether acetate, 25.31 parts of ethyl 3-ethoxypropionate, 8.42 parts of n-butanol, 0.002 parts of Irgacure 369, 0.01 parts of OXE-02, 0.01 parts of adhesion promotor A-186 and 0.04 parts of levelling agent BYK 333, stirring and mixing them uniformly. Then, the above components after uniform mixing are defoamed for three times, each for 45 minutes to obtain a mixture. The resulting mixture is filtered for removal of impurities, to give a blue photoresist 4.

Preparation of a color film substrate 4, comprising:

Coating a black photoresist on a substrate to form a black matrix; forming red, green, and blue color filter films successively on the regions of the substrate partitioned by the black matrix via processes such as pre-baking and curing, wherein the blue color filter film is prepared by the blue photoresist 4 of this Example; successively preparing a protective layer and a transparent electrode layer on the color filter film; and forming a padding on the electrode layer.

The performance tests are conducted on the color film substrate 4, and the results are as follows:

| | |
|---|---|
| Infrared ray specific radiance % | 81 |
| Negative ion (number/cubic centimeter) | 1222 |
| Transmittance | 82 |
| Color coordinate (x, y) | (0.149, 0.789) |
| E value | 2.1 |

Example 14

Preparation of a green photoresist 5, comprising:

Weighing, in parts by weight, 0.58 parts of a functional material (Example 5), 7.5 parts of P.G.36 (available from DIC) and P.Y.139 (a colorant), 7 parts of SB401 (an alkaline soluble resin), 5 parts of SB404 (an alkaline soluble resin), 8 parts of DPHA (an unsaturated monomer), 5 parts of EBE264 (an unsaturated monomer, available from Cytec Industries (shanghai) Co. Ltd.), 0.005 parts of Irgacure 369 (an initiator, available from Irgacure), 0.01 parts of ITX (an initiator, available from Ciba), 0.02 parts of adhesion promotor A-186 (available from Dow Corning) and 0.03 parts of wetting levelling agent BYK 333 (available from BYK); dissolving them in 50 parts of PGMEA (a solvent); stirring and mixing them uniformly.

The raw materials after uniform mixing are defoamed twice, each for 35 minutes to obtain a mixture. The resulting mixture is filtered for removal of impurities, to give a green photoresist 5.

Preparation of a color film substrate 5, comprising:

Coating a black photoresist on a substrate to form a black matrix; forming red, green, and blue color filter films successively on the regions of the substrate partitioned by the black matrix via processes such as pre-baking and curing, wherein the green color filter film is prepared by the green photoresist 5 of this Example; successively preparing a protective layer and a transparent electrode layer on the color filter film; and forming a padding on the electrode layer.

The performance tests are conducted on the color film substrate 5, and the results are as follows:

| | |
|---|---|
| Infrared ray specific radiance % | 88 |
| Negative ion (number/cubic centimeter) | 2790 |
| Transmittance | 90 |
| Color coordinate (x, y) | (0.310, 0.578) |
| E value | 1.8 |

Example 15

Preparation of a green photoresist 6, comprising:

Weighing, in parts by weight, 0.65 parts of a functional material (Example 3), 7.5 parts of a mixture of P.G.36 and P.Y.139 (a colorant), 9 parts of SB 401 (an alkaline soluble resin), 4 parts of SB 404 (an alkaline soluble resin), 7.5 parts of EBE 264 (an unsaturated monomer), 8 parts of DPHA (an unsaturated monomer), 0.01 parts of Irgacure 369 (an initiator), 0.005 parts of ITX (an initiator), 0.01 parts of adhesion promotor A-186, and 0.04 parts of wetting levelling agent BYK 333; dissolving them in 50 parts of PGMEA (a solvent), stirring and mixing them uniformly.

The raw materials after uniform mixing are defoamed twice, each for 35 minutes to obtain a mixture. The resulting mixture is filtered for removal of impurities, to give a green photoresist 6.

Preparation of a color film substrate 6, comprising:

Coating a black photoresist on a substrate to form a black matrix; forming red, green, and blue color filter films successively on the regions of the substrate partitioned by the black matrix via processes such as pre-baking and curing, wherein the green color filter film is prepared by the green photoresist 6 of this Example; successively preparing a protective layer and a transparent electrode layer on the color filter film; and forming a padding on the electrode layer.

The performance tests are conducted on the color film substrate 6, and the results are as follows:

| | |
|---|---|
| Infrared ray specific radiance % | 81 |
| Negative ion (number/cubic centimeter) | 2270 |
| Transmittance | 92 |
| Color coordinate (x, y) | (0.310, 0.578) |
| E value | 1.5 |

Example 16

Preparation of a yellow photoresist 7, comprising:

Weighing, in parts by weight, 0.80 parts of a functional material (Example 7), 8 parts of P.Y.138 (a colorant, available from DIC), 8 parts of SB 401 (an alkaline soluble resin), 4 parts of SB 404 (an alkaline soluble resin), 10 parts of DPHA (an unsaturated monomer), 3 parts of EBE 350 (an unsaturated monomer), 0.012 parts of Irgacure 369 (an initiator), 0.02 parts of adhesion promotor A-186, and 0.03 parts of wetting levelling agent BYK 333; dissolving them in 50 parts of PGMEA (a solvent); stirring and mixing them uniformly.

The raw materials after uniform mixing are defoamed twice, each for 35 minutes to obtain a mixture. The resulting mixture is filtered for removal of impurities, to give a yellow photoresist 7.

Preparation of a color film substrate 7, comprising:

Coating a black photoresist on a substrate to form a black matrix; forming red, green, and blue color filter films successively on the regions of the substrate partitioned by the black matrix via processes such as pre-baking and curing, wherein the yellow color filter film is prepared by the yellow photoresist 7 of this Example; successively preparing a protective layer and a transparent electrode layer on the color filter film; and forming a padding on the electrode layer.

The performance tests are conducted on the color film substrate 7, and the results are as follows:

| Infrared ray specific radiance % | 75 |
| Negative ion (number/cubic centimeter) | 1700 |
| Transmittance | 92 |
| Color coordinate (x, y) | (0.4380, 0.502) |
| E value | 2.0 |

Example 17

Preparation of a yellow photoresist 8, comprising:

Weighing, in parts by weight, 0.78 parts of a functional material (Example 6), 8 parts of P.Y.138 (a colorant), 7.5 parts of SB 401 (an alkaline soluble resin), 4.5 parts of SB 404 (an alkaline soluble resin), 8 parts of DPHA (an unsaturated monomer), 6 parts of EBE 350 (an unsaturated monomer), 0.12 parts of Irgacure 369 (an initiator), 0.03 parts of adhesion promotor A-186, and 0.02 parts of wetting levelling agent BYK 333; dissolving them in 50 parts of PGMEA (a solvent); stirring and mixing them uniformly.

The raw materials after uniform mixing are defoamed twice, each for 35 minutes to obtain a mixture. The resulting mixture is filtered for removal of impurities, to give a yellow photoresist 8.

Preparation of a color film substrate 8, comprising:

Coating a black photoresist on a substrate to form a black matrix; forming red, green, and blue color filter films successively on the regions of the substrate partitioned by the black matrix via processes such as pre-baking and curing, wherein the yellow color filter film is prepared by the yellow photoresist 8 of this Example; successively preparing a protective layer and a transparent electrode layer on the color filter film; and forming a padding on the electrode layer.

The performance tests are conducted on the color film substrate 8, and the results are as follows:

| Infrared ray specific radiance % | 98 |
| Negative ion (number/cubic centimeter) | 870 |
| Transmittance | 93.6 |
| Color coordinate (x, y) | (0.438, 0.502) |
| E value | 2.0 |

Example 18

Preparation of a black photoresist 9, comprising:

Firstly, weighing, in parts by weight, 0.5 parts of a modified functional material (Example 1), 6 parts of Raven 760 (a colorant, available from Columbia), 11 parts of aromatic acid acrylic half ester SB 401, 4 parts of aromatic acid acrylic half ester SB 404, 7 parts of EBE 350, 8 parts of DPHA, 29.868 parts of propylene glycol monomethyl ether acetate, 25.22 parts of ethyl 3-ethoxypropionate, 8.35 parts of n-butanol, 0.003 parts of Irgacure 369, 0.009 parts of OXE-01, 0.02 parts of adhesion promotor A-186 and 0.03 parts of levelling agent BYK 333; stirring and mixing them uniformly. Then, the raw materials after uniform mixing are defoamed twice, each for 35 minutes to obtain a mixture. The resulting mixture is filtered for removal of impurities, to give a black photoresist 9.

Preparation of a color film substrate 9, comprising:

Coating a black photoresist 9 of this example on a substrate to form a black matrix; forming red, green, and blue color filter films successively on the regions of the substrate partitioned by the black matrix via processes such as pre-baking and curing; successively preparing a protective layer and a transparent electrode layer on the color filter film; and forming a padding on the electrode layer.

The performance tests are conducted on the color film substrate 9, and the results are as follows:

| Infrared ray specific radiance % | 52 |
| Negative ion (number/cubic centimeter) | 801 |
| OD Value | 4.7 |

Example 19

Preparation of a black photoresist 10, comprising:

Firstly, weighing, in parts by weight, 0.57 parts of a modified functional material (Example 3), 6 parts of Raven 760, 9 parts of aromatic acid acrylic half ester SB 401, 3 parts of aromatic acid acrylic half ester SB 404, 6 parts of EBE 350, 9 parts of DPHA, 29.418 parts of propylene glycol monomethyl ether acetate, 25.45 parts of ethyl 3-ethoxypropionate, 8.5 parts of n-butanol, 0.005 parts of Irgacure 369, 0.007 parts of OXE-01, 0.03 parts of adhesion promotor A-186 and 0.02 parts of levelling agent BYK 333; stirring and mixing them uniformly. Then, the raw materials after uniform mixing are defoamed for three times, each for 35 minutes to obtain a mixture. The resulting mixture is filtered for removal of impurities, to give a black photoresist 10.

Preparation of a color film substrate 10, comprising:

Coating a black photoresist 10 of this example on a substrate to form a black matrix; forming red, green, and blue color filter films successively on the regions of the substrate partitioned by the black matrix via processes such as pre-baking and curing; successively preparing a protective layer and a transparent electrode layer on the color filter film; and forming a padding on the electrode layer.

The performance tests are conducted on the color film substrate 10, and the results are as follows:

| Infrared ray specific radiance % | 66 |
| Negative ion (number/cubic centimeter) | 833 |
| OD Value | 4.65 |

Example 20

Preparation of a black photoresist 11, comprising:

Weighing, in parts by weight, 0.76 parts of a modified functional material (Example 5), 6 parts of Raven 760, 3 parts of aromatic acid acrylic half ester SB 401, 12 parts of aromatic acid acrylic half ester SB 404, 5 parts of EBE 350, 10 parts of DPHA, 29.338 parts of propylene glycol monomethyl ether acetate, 25.61 parts of ethyl 3-ethoxypropionate, 8.23 parts of n-butanol, 0.003 parts of Irgacure 369, 0.009 parts of OXE-02, 0.01 parts of adhesion promotor A-186 and 0.04 parts of levelling agent BYK 333; stirring and mixing them uniformly. Then, the raw materials after uniform mixing are defoamed for three times, each for 40 minutes to obtain a mixture. The resulting mixture is filtered for removal of impurities, to give a black photoresist 11.

Preparation of a color film substrate 11, comprising:

Coating a black photoresist 11 of this example on a substrate to form a black matrix; forming red, green, and blue color filter films successively on the regions of the substrate partitioned by the black matrix via processes such as pre-baking and curing; successively preparing a protective layer and a transparent electrode layer on the color filter film; and forming a padding on the electrode layer.

The performance tests are conducted on the color film substrate 11, and the results are as follows:

| | |
|---|---|
| Infrared ray specific radiance % | 81 |
| Negative ion (number/cubic centimeter) | 1222 |
| OD Value | 4.47 |

Example 21

Preparation of a padding material 12, comprising:

Weighing, in parts by weight, 0.76 parts of a modified functional material (Example 3), 3 parts of aromatic acid acrylic half ester SB 401, 12 parts of aromatic acid acrylic half ester SB 404, 5 parts of EBE 350, 10 parts of DPHA, 31.338 parts of propylene glycol monomethyl ether acetate, 27.61 parts of ethyl 3-ethoxypropionate, 10.23 parts of n-butanol, 0.003 parts of Irgacure 369, 0.009 parts of OXE-02, 0.01 parts of adhesion promotor A-186 and 0.04 parts of levelling agent BYK 333; stirring and mixing them uniformly. Then, the raw materials after uniform mixing are defoamed for three times, each for 40 minutes to obtain a mixture. The resulting mixture is filtered for removal of impurities, to give a padding material 12.

Preparation of a color film substrate 12

First, a black matrix and a light filer layer are formed on a substrate, respectively. Then, a protective layer and a transparent electrode layer are formed on the substrate with the black matrix and the light filer layer formed thereon. Last, a padding material 12 is coated on the substrate and padding is formed via processes such as pre-baking and curing, to obtain a color film substrate 12.

The performance tests are conducted on the color film substrate 12, and the results are as follows:

| | |
|---|---|
| Infrared ray specific radiance % | 92 |
| Negative ion (number/cubic centimeter) | 1664 |
| Transmittance | 89 |

Example 22

Preparation of padding material 13

Firstly, weighing, in parts by weight, 0.82 parts of a modified functional material (Example 3), 11 parts of aromatic acid acrylic half ester SB 401, 4 parts of aromatic acid acrylic half ester SB 404, 6 parts of EBE 350, 9 parts of DPHA, 31.348 parts of propylene glycol monomethyl ether acetate, 27.75 parts of ethyl 3-ethoxypropionate, 10.02 parts of n-butanol, 0.004 parts of Irgacure 369, 0.008 parts of OXE-02, 0.03 parts of adhesion promotor A-186 and 0.02 parts of levelling agent BYK 333; stirring and mixing them uniformly. Then, the raw materials after uniform mixing are defoamed for three times, each for 45 minutes to obtain a mixture. The resulting mixture is filtered for removal of impurities, to give a padding material 13.

Preparation of a color film substrate 13

First, a black matrix and a light filer layer are formed on a substrate, respectively. Then, a protective layer and a transparent electrode layer are formed on the substrate with the black matrix and the light filer layer formed thereon. Last, a padding material 13 is coated on the substrate and padding is formed via processes such as pre-baking and curing, to obtain a color film substrate 13.

The performance tests are conducted on the color film substrate 13, and the results are as follows:

| | |
|---|---|
| Infrared ray specific radiance % | 91 |
| Negative ion (number/cubic centimeter) | 2520 |
| Transmittance | 87 |

Example 23

Preparation of a protective layer material 14, comprising:

Weighing, in parts by weight, 0.75 parts of a modified functional material 3, 12 parts of polyurethane acrylate EBE264, 8 parts of an epoxy resin DEN 438 (available from Dow Chemical Company), 45 parts of PGMEA, 25 parts of N-methyl pyrrolidone, 5 parts of an coupling agent A-186; stirring and mixing them uniformly. Then, the raw materials after uniform mixing are defoamed for three times, each for 40 minutes to obtain a mixture. The resulting mixture is filtered for removal of impurities, to give a protective layer material 14.

Preparation of a color film substrate 14

First, a black matrix and a light filer layer are formed on a substrate, respectively. Then, a protective layer and a transparent electrode layer are formed on the substrate with the black matrix and the light filer layer formed thereon. Last, a protective layer material 14 is coated on the substrate and a protective layer is formed via processes such as pre-baking and curing, to obtain a color film substrate 14.

The performance tests are conducted on the color film substrate 14, and the results are as follows:

| | |
|---|---|
| Infrared ray specific radiance % | 90 |
| Negative ion (number/cubic centimeter) | 2500 |
| Transmittance | 94 |

Example 24

Preparation of a protective layer material 15, comprising:

Weighing, in parts by weight, 0.50 parts of a modified functional material (Example 4), 12 parts of polyurethane acrylate EBE 350, 10 parts of an epoxy resin DEN 438, 60 parts of PGMEA, 10 parts of N-methyl pyrrolidone, 4 parts of an coupling agent A-186; stirring and mixing them uniformly. Then, the raw materials after uniform mixing are defoamed for three times, each for 40 minutes to obtain a mixture. The resulting mixture is filtered for removal of impurities, to give a protective layer material 15.

Preparation of a color film substrate 15

First, a black matrix and a light filer layer are formed on a substrate, respectively. Then, a protective layer and a transparent electrode layer are formed on the substrate with the black matrix and the light filer layer formed thereon. Last, a protective layer material 15 is coated on the substrate and a protective layer is formed via processes such as pre-baking and curing, to obtain a color film substrate 15.

The performance tests are conducted on the color film substrate 15, and the results are as follows:

| | |
|---|---|
| Infrared ray specific radiance % | 60 |
| Negative ion (number/cubic centimeter) | 810 |
| Transmittance | 97 |

Performance Tests

The color film substrates prepared in the above Examples 10 to 24 are tested (actually the color filter film, black matrix, padding, and protective layer therein are tested), to obtain the performance parameters thereof. The tests comprise:

(1) Infrared Ray Specific Radiance Test

The color film substrates 1 to 15 (corresponding to the color film substrates of the color filter film, black matrix, padding, and protective layer) prepared in the above Examples 10 to 24 are cut into test sheets of 5×5 cm². Each of the test sheets is tested for Infrared ray specific radiance with reference to GB/T 7287-2008 standard, respectively, and specific test procedures are as follows:

1) successively applying a rated working voltage to each test sheet, testing surface temperature distribution of the sample with a radiation temperature tester (with an accuracy of no less than ±1%) after the temperature is stable, determining the working temperature of an isothermal region in a central position therein, and then cutting off electricity and cooling to room temperature.

2) successively fixing each test sheet to a sample support (having a function of three-dimensional continuous adjustability), and adjusting an optical system to meet the following requirements: □ a photosensitive modulation-free plane, aperture plane and each display structure radiating surface are parallel and co-axial to each other; □ the area to be tested for each color film substrate as determined by the optical system, relative to the tester, can be approximated as a "point source" and be located in the isothermal region and less than the area of the isothermal region.

3) welding or bonding a thermocouple of a temperature controller nearby the surface to be tested (within the isothermal region), controlling the temperature of the surface to be tested within a working temperature thereof with the temperature controller (with a temperature-controlling accuracy of no less than ±0.5K). After the temperature is stable, turning on the scanning device of a monochromator to make it continuously scan within a range of wave length of 0.38-25 μm while synchronizing it with a recorder, and testing a curve of a relationship of differential spectrum signal voltage $U_{S\lambda}$ between a sample output by a magnification system and modulation reticle with wave length changing.

4) turning off the temperature controller; uniformly coating a reference coating having a thickness of 0.2 mm within the isothermal region after each test sheet is cooled to room temperature, by a method which is consistent with the original measuring method for obtaining the emittance data thereof; then turning on the temperature controller, and testing a curve of relationship of differential spectrum signal voltage $U_{1\lambda}$ between a reference coating output by a magnification system and modulation reticle with wave length changing, according to a method of step3)

5) removing each test sheet, and testing a curve of relationship of differential spectrum signal voltage $U_{w\lambda}$ between a background output by a magnification system and modulation reticle with wave length changing.

6) measuring apparent working temperature Tr of isothermal region with a radiating temperature tester.

7) calculating an Infrared ray specific radiance of each test sheet at the working temperature according to the calculation formula under GB/T 7287-2008 standard item.

The Infrared ray specific radiance is a ratio of the above apparent working temperature of isothermal region of each display structure to the apparent working temperature of isothermal region coated with a reference coating. The value thereof is between 0%-100%, and a higher value shows a better infrared radiation. It is generally believed that a value of the Infrared ray specific radiance greater than 40% will produce beneficial effect on the health of human body.

It can be seen that, the Infrared ray specific radiance of the display structure of each example of the present invention exceeds 40%. Therefore, it demonstrates that they can produce far infrared ray at ambient temperature, help to promote the metabolism of human body issues, improve the immunity of the body, and have a function of health care.

(2) Negative Ion Concentration Test 1) measuring the negative ion concentration Db in an environmental background air using an air negative ion tester with a resolution of 10/cm³.

2) cutting the color film substrates 1 to 15 (corresponding to the color film substrates of the color filter film, black matrix, padding, and protective layer) prepared in the above Examples 10 to 24 into test sheets of 5×5 cm², placing each test sheet at 2 cm away from air input port of the air negative ion tester, and testing in a state of shaking or friction to measure the negative ion concentration Da of each test sheet. Each test sheet is tested for 5 times, and a larger value is taken as a measuring result.

3) calculating effective negative ion concentration of each test sheet, i.e., D=Da−Db.

The negative ion concentration refers to the numbers of negative ions in a unit volume of air. The more the numbers of negative ions, the higher negative ion concentration, and the stronger capabilities of reducing pollution and improving the air quality thereof. It is generally believed that, for display structure production workshop, if the negative ion concentration is higher than 800/cm³, it can achieve a purpose of purifying air.

It can be seen that, the negative ion concentration of the display structure of each Example of the present invention is higher than 800/cm³. Therefore, it demonstrates that they can release enough negative ions, and improve the production environment of the display structure.

(3) Chemical Resistance Test

Chemical resistance test is conducted on the padding as following. The color film substrates 12 to 15 (corresponding to the color film substrates of the padding and protective layer) prepared in the above Examples 21 to 24 are cut into test sheets of 10×10 cm$^2$. The test sheets are placed in a 5% NaOH solution at room temperature, taken out after 20 minutes, washed, and completely dried at 50° C. Each of the treated test sheets is placed under a spectrophotometer, and tested for transmittance after focusing and alignment.

Chemical resistance represents capability of corrosion resistance of the display structure under conditions of acidic, basic or corrosive solvent, which is one of reliability requirements of the display structure. Transmittance is a ratio of radiation energy penetrating an article to all of the radiation energy projected on the article in a process of departure of incident light flux from radiated plane or incident plane of a medium to another plane. Higher transmittance shows higher luminance. It is generally believed that value of transmittance greater than 80% indicates that the transmittance of the display structure reaches the standard.

It can be seen that, the transmittance of the display structure (padding) of each Example of the present invention exceeds 80%. Therefore, it demonstrates that they can also guarantee good transmittance upon being subject to corrosion. That is, the addition of the functional material does not impart adverse effect on the chemical resistance and transmittance properties of the display structure.

(4) Heat Resistance Test

Heat resistance test can be conducted on the colored and nonopaque display structure such as color filter film. The specifics are as follows:

1) cutting the color film substrates 1 to 10 (corresponding to the color film substrates of the color filter film) prepared in the above Examples 10 to 19 into test sheets of 10×10 cm$^2$, and placing the test sheets at a temperature of 100° C. for 30 minutes.

2) placing each test sheet after heat treatment in a spectrophotometer to measure color coordinates, comparing them with standard color coordinates to calculate ΔE value.

Heat resistance shows a capability of high temperature resistance of the display structure, which is also one of reliability requirements of the display structure. Evaluation standard thereof is taken as color difference ΔE value, i.e., a ratio of color coordinate value of the treated display structure to standard color coordinate value. It is generally believed that a ΔE value less than 3 represents that heat resistance property meets the standard.

It can be seen that the ΔE value of the display structure (color filter film) of each Example of the present invention is less than 3. Therefore, it demonstrates that they have good heat resistance. That is, the addition of the functional material does not impart adverse effect on heat resistance of the display structure.

(5) OD Value (Optical Density) Test

OP value test can be conducted for black matrix, comprising: cutting the color film substrates 9 to 11 (corresponding to the color film substrates of the black matrix) prepared in the above Examples 18 to 20 into test sheets of 5×5 cm$^2$, placing test sheet under a X-Rite 528 type optical densitometer at room temperature, focusing and aligning, and testing OD value of each test sheet.

OD value is a commonly-used logarithm value of a transmittance ratio of incident light to transmission light. It is believed that a higher OD value shows a better color contrast of black matrix. It is generally believed that a OD value greater than 4 represents that the color contrast meets the standard.

As can be seen, the OD value of the black matrix of each Example of the present invention is greater than 4. Therefore, it demonstratess that their color contrasts all meet the standard. This illustrates that addition of the functional material of the present invention Example does not impart adverse effect on the optical performance of the black matrix.

It should be understood that, the above embodiments are illustrative embodiments used for the illustration of the principle of the present invention. However, the present invention is not limited to these embodiments. Various variations and modifications can be made without departing from the spirit and nature of the present invention, which are deemed as falling within the protection scope of the present invention.

The invention claimed is:

1. A functional material comprising inorganic mixed powder, the inorganic mixed powder comprises a main material and an auxiliary material,
   the main material comprises boron oxide, sodium oxide, lithium oxide, and zirconium oxide,
   the auxiliary material comprises any one or more of aluminum oxide, zinc oxide, titanium dioxide, silicon dioxide, calcium oxide, silver complex, silver phosphate, silver nitrate, tourmaline, silver thiosulfate, carbon nanotube, aluminum sulfate, manganese, oxides of manganese, iron, oxides of iron, cobalt, oxides of cobalt, nickel, oxides of nickel, chromium, oxides of chromium, copper, oxides of copper, magnesium oxide, boron carbide, silicon carbide, titanium carbide, zirconium carbide, tantalum carbide, molybdenum carbide, boron nitride, chromium nitride, titanium nitride, zirconium nitride, aluminum nitride, chromium boride, trichromium tetraborate, titanium boride, zirconium boride, tungsten disilicide and titanium disilicide,
   wherein the inorganic mixed powder has a surface modified layer formed by a light curable alkaline soluble resin having a molecular weight less than or equal to 5000 and greater than or equal to 2500.

2. The functional material according to claim 1, wherein, the inorganic mixed powder further comprises an addition material, the addition material comprises:
   any one or more of graphite, mica, indigo stone, calcite, crystal fluorite, maifanite, and mullite.

3. The functional material according to claim 2, wherein, the addition material is in an amount of 1-5% of the total weight amount of the main material and auxiliary material.

4. The functional material according to claim 1, wherein, the inorganic mixed powder has a particle diameter from 20 to 300 nm.

5. The functional material according to claim 1, wherein, the surface modified layer is formed by copolymerization of a polymerizable vinylated unsaturated monomer and an organic anhydride.

6. The functional material according to claim 5, wherein, the polymerizable vinylated unsaturated monomer is any one of styrene, vinyl toluene, p-chloro styrene, methoxy styrene, α-methyl styrene, isoprene; and
   the organic anhydride is any one of maleic anhydride, cis-butenedioic anhydride, fumaric anhydride, itaconic anhydride, citraconic anhydride, pyromellitic dianhydride, biphenyltetracarboxylic dianhydride, benzophenonetetracarboxylic dianhydride, oxygen biphenyltetracarboxylic dianhydride, and isopropyl diphthalic anhydride.

7. The functional material according to claim 5, wherein, the inorganic mixed powder, the organic anhydride, and the polymerizable vinylated unsaturated monomer are in a weight ratio of 1:(0.8-1.2):(0.85-1.15).

8. The functional material according to claim 5, wherein, the inorganic mixed powder comprises, based on parts by weight:
   boron oxide: 1.5-10 parts;
   sodium oxide: 0.5-5 parts;
   lithium oxide: 0.2-20 parts;
   zirconium oxide: 10-50 parts;
   aluminum oxide: 5-40 parts;
   titanium dioxide: 0.5-8 parts.

9. The functional material according to claim 8, wherein, the inorganic mixed powder comprises, based on parts by weight:
   boron oxide: 3-8 parts;
   sodium oxide: 1.5-4.5 parts;
   lithium oxide: 1.5-18 parts;
   zirconium oxide: 15-45 parts;
   aluminum oxide: 8-32 parts;
   titanium dioxide: 1.5-7 parts.

10. A display structure forming material, comprising: an alkaline soluble resin, an unsaturated monomer, an initiator, a solvent, and the functional material according to claim 1.

11. The display structure forming material according to claim 10, wherein, the display structure forming material is a photoresist, the photoresist further comprising a colorant.

12. The display structure forming material according to claim 11, wherein, the photoresist comprises, based on parts by weight:
   a functional material: 0.2-1.2 parts;
   a colorant: 2-15 parts;
   an alkaline soluble resin: 2-20 parts;
   an unsaturated monomer: 2-20 parts;
   an initiator: 0.01-1 parts;
   a solvent: 30-90 parts;
   an additive: 0.005-0.02 parts.

13. The display structure forming material according to claim 12, wherein,
   the photoresist is any one of a red photoresist, a blue photoresist, a green photoresist, a yellow photoresist, and a black photoresist.

14. The display structure forming material according to claim 10, wherein, the display structure forming material is a padding material.

15. The display structure forming material according to claim 14, wherein, the padding material comprises, based on parts by weight:
   a functional material: 0.2-1.2 parts;
   an alkaline soluble resin: 5-20 parts;
   an unsaturated monomer: 5-20 parts;
   an initiator: 0.01-1 parts;
   a solvent: 30-90 parts;
   an additive: 0.005-0.02 parts.

16. The display structure forming material according to claim 10, wherein,
   the initiator is a photo-initiator or a thermal initiator.

17. A color film substrate, comprising multiple display structures, wherein, at least one of the display structures are prepared by the display structure forming material of claim 10.

18. A display device, comprising the color film substrate of claim 17.

19. The display device according to claim 18, wherein, the display device is any one of a computer display, a television, a mobile phone, a tablet computer, a notebook computer, a digital camera, an electronic paper, and a navigator.

20. A display structure forming material, wherein, the display structure forming material is a protective layer material, the protective layer material comprising, based on parts by weight:
   a functional material according to claim 1: 0.2-1.2 parts;
   an acrylic resin: 5-25 parts;
   an coupling agent: 1-15 parts;
   an epoxy resin: 1-20 parts;
   a solvent: 70-80 parts.

21. A color film substrate, comprising multiple display structures, wherein, at least one of the display structures are prepared by the display structure forming material of claim 20.

22. A display device, comprising the color film substrate of claim 21.

23. The display device according to claim 22, wherein, the display device is any one of a computer display, a television, a mobile phone, a tablet computer, a notebook computer, a digital camera, an electronic paper, and a navigator.

24. A method for preparing the functional material according to claim 1, comprising:
   grinding and mixing the main material, auxiliary material and optional addition material with the use of a dispersant to obtain the inorganic mixed powder.

25. The method according to claim 24, wherein, the grinding and mixing comprises:
   grinding the main material, the auxiliary material and optional addition material, respectively, followed by mixing them together; or
   mixing the main material, the auxiliary material and optional addition material together followed by grinding them.

26. The method according to claim 24, wherein, the method further comprises:
   after obtaining the inorganic mixed powder, forming the surface modified layer on the inorganic mixed powder.

27. The method according to claim 26, wherein, the surface modified layer is formed by copolymerization of a polymerizable vinylated unsaturated monomer and an organic anhydride, and forming the surface modified layer on the inorganic mixed powder comprises:
   step S1: mixing the inorganic mixed powder, the organic anhydride, the polymerizable vinylated unsaturated monomer with a solvent and an initiator to incur a reaction;
   step S2: separating the functional material after the reaction is complete.

28. The method according to claim 27, wherein, the step S1 comprises:
   step S11: at room temperature, charging the inorganic mixed powder into a reaction container with continuous stirring, and subsequently adding the solvent, the organic anhydride, and at least a portion of the polymerizable vinylated unsaturated monomer into the reaction container and mixing them uniformly;
   step S12: adding dropwise the initiator into the reaction container for carrying out the reaction.

29. The method according to claim 28, wherein,
   the polymerizable vinylated unsaturated monomer added in the step S11 comprises $2/3$ to $3/4$ of the total amount of the polymerizable vinylated unsaturated monomer involved in the reaction;

in the step S12, the initiator, after mixing with the remaining polymerizable vinylated unsaturated monomer, is adding dropwise into the reaction container.

30. The method according to claim 27, wherein, the reaction of the step S1 comprises two stages, wherein:
a first stage is reacting at 35-40° C. for 60-90 min;
a second stage is reacting at 60-70° C. for 60-80 min.

31. The method according to claim 27, wherein, the reaction of the step S1 is carried out under the protection of an inert atmosphere.

32. The method according to claim 27, wherein, the step S2 comprises:
cooling the reaction solution with continuous stirring until a crystal is completely precipitated from the reaction solution, and drying the crystal under reduced pressure to obtain the functional material.

33. The method according to claim 32, wherein, the temperature of cooling is 0-10° C.

34. The method according to claim 27, wherein, the initiator is an azo initiator.

35. The method according to claim 27, wherein,
the inorganic mixed powder, the organic anhydride, the polymerizable vinylated unsaturated monomer are in a weight ratio of 1:(0.8-1.2):(0.85-1.15): and
the inorganic mixed powder, the initiator, the solvent are in a weight ratio of 1:(0.25-0.4):(1-1.5).

* * * * *